United States Patent [19]

Kieburtz et al.

[11] 3,906,199

[45] Sept. 16, 1975

[54] DIGITAL FILTER CIRCUIT

[75] Inventors: Robert Bruce Kieburtz, Fair Haven; Kent Vincent Mina, Colts Neck, both of N.J.

[73] Assignee: Bell Telephone Laboratories, Incorporated, Murray Hill, N.J.

[22] Filed: Dec. 13, 1974

[21] Appl. No.: 532,469

[52] U.S. Cl. .................................. 235/152; 235/156
[51] Int. Cl.$^2$ ....................... G06F 15/20; G06F 7/39
[58] Field of Search ............................. 235/152, 156

[56] References Cited

UNITED STATES PATENTS

| | | | |
|---|---|---|---|
| 3,609,568 | 9/1971 | Jackson | 235/156 X |
| 3,749,895 | 7/1973 | Kao | 235/152 |

OTHER PUBLICATIONS

Jackson, L. B. *An Analysis of Limit Cycles Due to Multiplication Rounding in Recursive Digital (Sub) Filters*. In Proc. 7th Ann. Allerton Conf. Circuit System Theory, pp. 69–78, 1969.

Jackson, L. B. et al. *An Approach to the Implementation of Digital Filters.* In IEEE Trans. Aud. and ElectroAc. AU-16(3): pp. 413–421, Sept. 1968.

Kieburtz, R. B. *An Experimental Study of Roundoff Effects in a Tenth-Order Recursive Digital Filter.* In IEEE Trans. Comm. Com–21(6): pp. 757–763, June 1973.

Nashelesky, L. *Introduction to Digital Computer Technology.* N.Y., J. Wiley, 1972, pp. 287–289.

Parker, S. R. et al. *Limit-Cycle Oscillations in Digital Filters.* In IEEE Trans. on Circuit Theory, CT–18(6): pp. 687–697. Nov. 1971.

*Primary Examiner*—R. Stephen Dildine, Jr.
*Attorney, Agent, or Firm*—R. A. Ryan

[57] ABSTRACT

Apparatus in a digital filter circuit for substantially eliminating limit cycle noise comprises means for randomly inhibiting the rounding signal in at least one of the multipliers comprising the digital filter circuit.

4 Claims, 3 Drawing Figures

DIGITAL FILTER CIRCUIT

FIELD OF THE INVENTION

This invention relates to digital signal processors and, more particularly, to recursive digital filter circuits for use in digital signal processors.

BACKGROUND OF THE INVENTION

Limit cycle noise is a well-known phenomenon in digital filter circuits. See, for example, "An Experimental Study of Roundoff Effects in a Tenth-Order Recursive Digital Filter" by R. B. Kieburtz, *IEEE Transactions on Communications*, Vol. COM-21, No. 6, June 1973, pages 757–763; "An Analysis of Limit Cycles Due to Multiplication in Recursive Digital (sub)Filters" by Leland B. Jackson, *Proceedings Seventh Annual Allerton Conference Circuit System Theory*, 1969, pages 69–78; "Limit-Cycle Oscillations in Digital Filters," S. R. Parker et al., *IEEE Transactions on Circuit Theory*, Vol. CT-18, No. 6, Nov. 1971, pages 687–697.

Suffice it to say that the limit cycles are periodic output signals from a digital filter under zero input or small input conditions. In particular, the limit cycle noise of interest here is that resulting from the rounding of multiplication products in a feedback loop. A well-known method of preventing this noise from degrading the signal to noise performance of the filter is to increase the word length of the internal processing inside the filter beyond the encoding accuracy of the input signal. Typically, a filter which receives a 15-bit encoded signal might have 21 bits of internal processing accuracy. This is generally enough to reduce the effect of both limit cycle and roundoff noise to a negligible level. However, in some cases roundoff noise during signal processing may not be subjectively noticeable, and it might be more economical to dispense with the extra bits of internal accuracy. This would still leave the limit cycles present and noticeable when the channel is completely quiet and no input signal is present. It is therefore an object of the present invention to reduce or substantially eliminate the limit cycles without increasing the word length of the internal processing.

It is a related object of the present invention to substantially eliminate cycles in a digital filter without adding costly circuit elements.

SUMMARY OF THE INVENTION

The above and other objects are achieved in accordance with the preferred embodiment of the present invention in which circuitry is provided for randomly inhibiting the rounding signal in the $\beta_2$ multiplier of a standard second order digital filter section. In particular, the output from a source of noise signals is ANDed with the rounding signals applied to the multiplier.

It is therefore a feature of the present invention that a multiplier in a digital filter is arranged to randomly truncate or round the final product of the input operands.

BRIEF DESCRIPTION OF THE DRAWINGS

These and other objects, features and advantages will become more apparent from a consideration of the following detailed description when read in connection with the attached drawing wherein.

DETAILED DESCRIPTION

Figure 1:
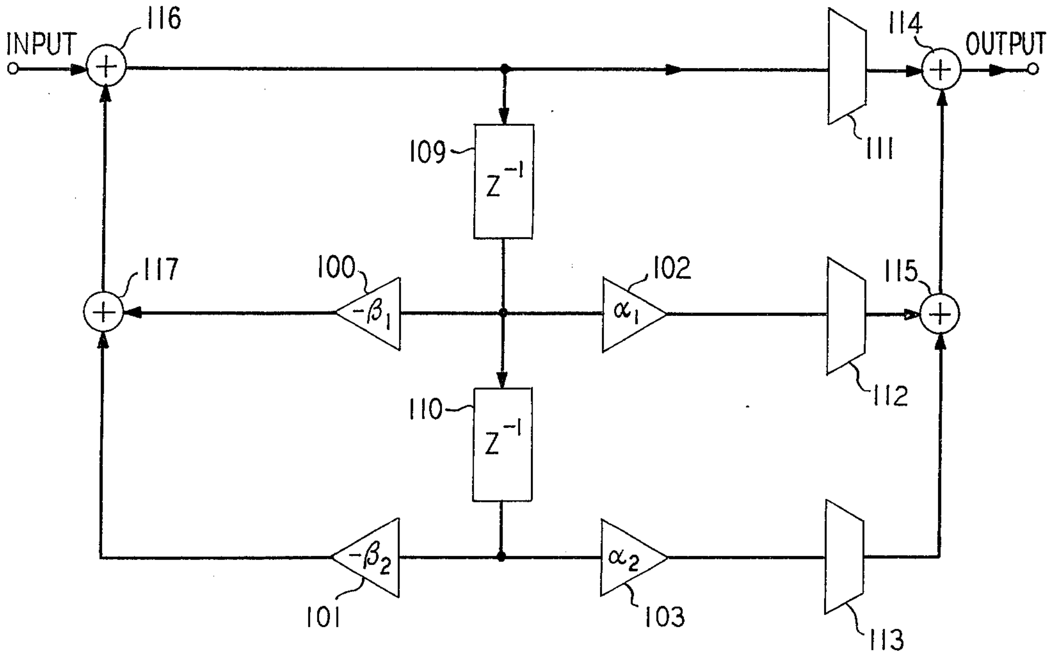
FIG. 1 illustrates a typical second-order digital filter section.

The second-order filter arrangement as illustrated in FIG. 1 is well known in the art. See, for example, "An Approach to the Implementation of Digital Filters" by L. B. Jackson et al., *IEEE Transactions on Audio and Electroacoustics*, Vol. AU-16, September 1968, pages 413–421. In standard fashion the circuit of FIG. 1 includes four multipliers, the $\beta_1$ multiplier 100, the $\beta_2$ multiplier 101, the $\alpha_1$ multiplier 102 and the $\alpha_2$ multiplier 103. In addition, the circuit also includes delay units 109 and 110, scaling units 111–113 and adders 114–117.

Although the scaling units have been shown as discrete units, it is understood that they are power of two multipliers (shift the data word one bit position to the left or right) and can be incorporated in the $\alpha_1$ and $\alpha_2$ multipliers illustrated in FIG. 1. The multipliers 100–103 are modular serial-parallel pipeline multipliers for multiplying sign and magnitude numbers. Such multipliers are well known in the art and are described, for example, in the above-cited Jackson et al. reference.

Figure 2:
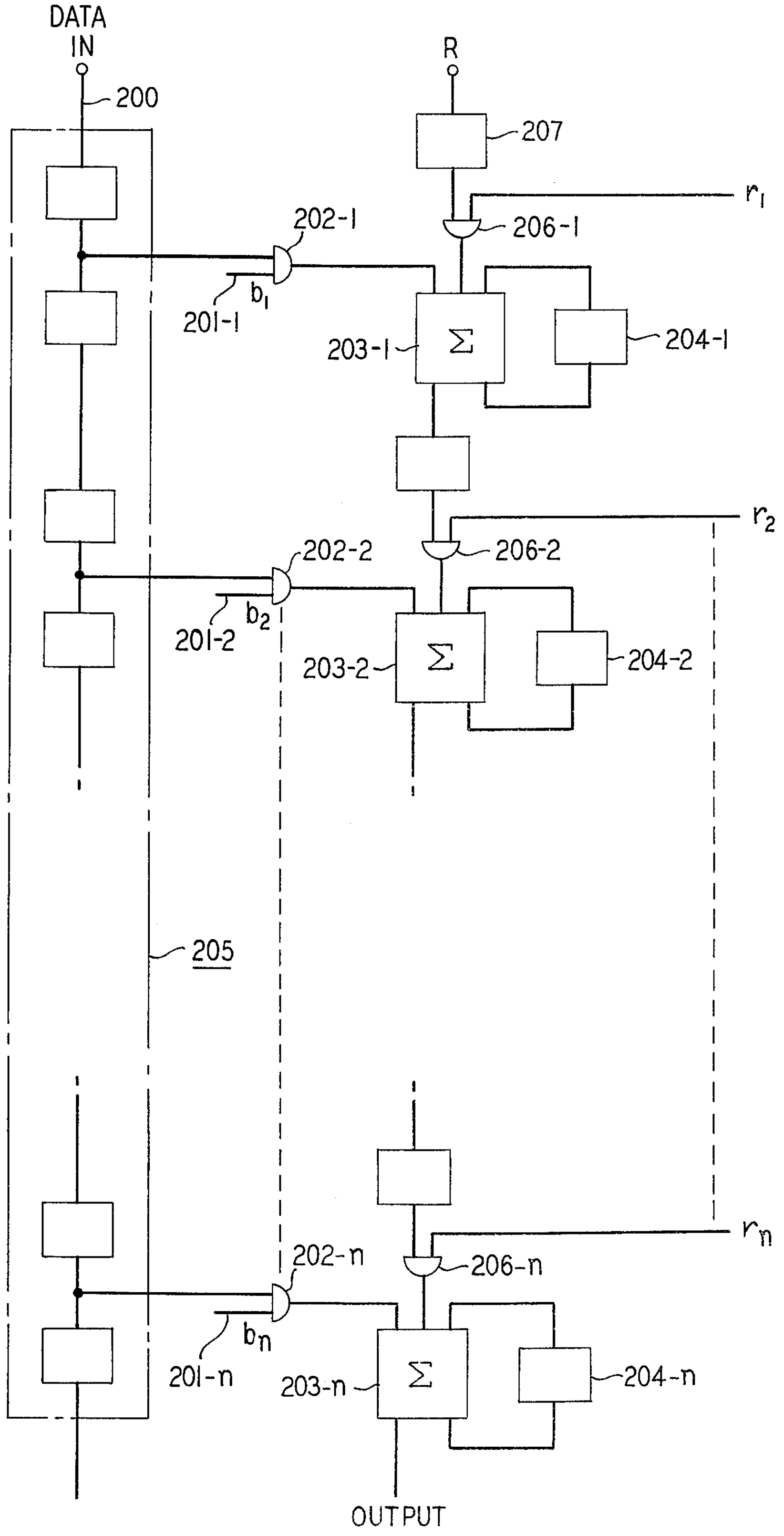
FIG. 2 shows a prior art pipeline sign and magnitude multiplier useful in a digital filter of the form shown in FIG. 1.

FIG. 2 illustrates a prior art multiplier useful in the circuit of FIG. 1 for multiplying a data word, applied LSB first at lead 200, by an n-bit coefficient word, $b_n b_{n-1} \ldots b_1$, input on leads 201-*i*, $i = 1,2, \ldots n$, respectively and where $b_1$ is the LSB. Such a circuit is described, for example, in application by R. B. Kieburtz filed Feb. 6, 1974 and designated Ser. No. 440,067. Each of the AND gates 202*i* generates a partial product term which is added by means of adders 203-*i* to the accumulated partial product terms from the preceding stage and any carry signals in flip-flops 204-*i*. Shift register 205 provides the appropriate delay for the data word bits. In addition, AND gates 206-*i* gate the accumulated partial product terms from the appropriate stage with the signals $r_i$. The signals $r_i$ are arranged to truncate the lower-order partial product terms to produce a final product no longer than the data word. Lastly, the signal R is applied to the topmost multiplier stage via flip-flop 207. The signal R is a logic 1 signal applied once during a data word interval and arranged to be added to the partial products forming the MSB of the truncated portion of the final product. Thus, if the MSB of the truncated (discarded) portion of the final product is 1, the addition of a 1 will generate a carry signal which will be added to the LSB of the retained portion of the final product. Similarly, if the MSB of the discarded portion of the final product is 0, the addition of a 1 will not generate a carry and, hence, there will be no resulting change in the retained final product. R, then, effects rounding of the retained portion of the final product. From the foregoing, it is clear that removal of the R signal from the topmost, or first, stage of the multiplier of FIG. 2 would yield a multiplier which truncates only.

Recalling the discussion above, multipliers in feedback loops such as those illustrated in FIG. 2 often produce limit cycle oscillations which adversely affect circuit operations in certain applications. FIG. 2 illustrates a single second order section. Higher order filters are produced by combining sections such as the single seconds order section of FIG. 2 in parallel or cascade form. For purposes of illustration, the present invention has been described in terms of the reduction of limit cycles in a single section order section. It is to be understood, however, that the same principles apply to higher order filters which typically exhibit more severe limit cycle noise.

Figure 3:
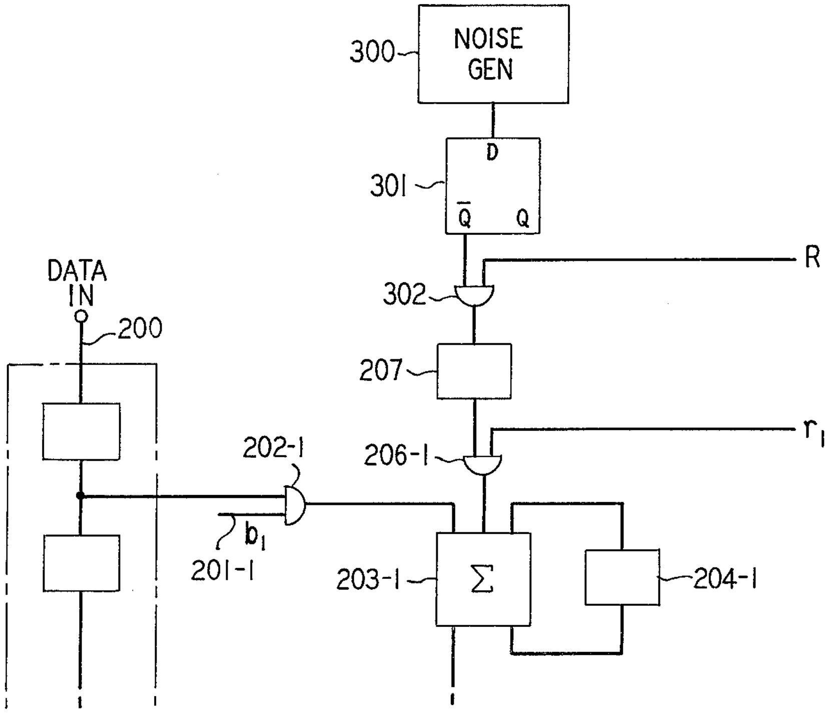
FIG. 3 illustrates a multiplier in accordance with the present invention useful in the digital filter of FIG. 1.

The circuit of FIG. 3 shows a modification to the first stage of the multiplier of FIG. 2 (typically the $\beta_2$ multiplier of FIG. 1 which modification virtually eliminates limit cycles in the filter.) In accordance with the circuit of FIG. 3 the output from a noise generator 300, such as a General Radio Model 1390-A Random Noise Generator, is applied to a D flip-flop 301. D flip-flops are well-known in the art. See, for example, L. Nashelsky, *Introduction to Digital Computer Technology*, J. Wiley, 1972, pages 287–289. The output from the $\overline{Q}$ output lead of the D flip-flop is, in turn, applied to AND gate 302 along with the rounding signal R and the output from AND gate 302 applied to flip-flop 207. In short, the noise generator 300 triggers the flip-flop 301 such that flip-flop 301 randomly generates 0 signals. The random 0 signals are gated via AND gate 302 with the rounding signal R. The result of this gating operation is that R is randomly inhibited.

The random interruption of the rounding signal in the $\beta_2$ multiplier results in the virtual elimination of limit cycle noise in the digital filter.

The circuit of FIG. 3 can be modified slightly to maintain the modularity of the multiplier. Specifically, in accordance with such an arrangement, the rounding signal, R, can be applied directly to the AND gate 206-1 in place of the truncation signal $r_1$. Thus, the first section of the multiplier assumes the same configuration as the other sections and the AND gate 302 and flip-flop 207 are no longer required.

While it has been assumed that the probability of a 0 signal appearing at the output of flip-flop 301 at any instant of time is 1/2, it is apparent that this probability can be altered, as desired, to any value between 0 and 1. In particular, suitable modifications can be made to the noise generator or simple circuitry added at the output of the noise generator or flip-flop 301 to alter this probability which alterations are well within the skill of an ordinary worker in the art.

Of course, as the probability of a 0 appearing at the output of flip-flop 301 approaches 1, truncation occurs almost exclusively. The result is an increase in noise in the presence of signals.

Alternatively, as the probability of a 0 at the output of flip-flop 301 approaches 0, rounding predominates.

Although the present invention has been described with respect to a preferred embodiment, it is clear that obvious modifications can be made to that embodiment which are within the spirit and scope of the present invention. For example, any source of randomly generated pulses, compatible with the parameters of the multiplier to which it is applied, can be used to inhibit the rounding signal. The design of such a source of pulses or the choice of a commercial unit is well within the skill of an ordinary worker in the art and that specific design or choice forms no part of the present invention as claimed. Further, as has been stated, the principles of the present invention are applicable to multipliers other than pipeline multipliers and to filter sections of higher order than second order sections.

What is claimed is:

1. Apparatus in a digital filter for generating the product of an ordered N-bit binary data word and an M-bit multiplier word, M $\geq$ 2, comprising A. M substantially identical stages, each comprising
   1. means for forming the bitwise product of one bit of said multiplier word and each bit of said data word,
   2. means for forming successive partial sums of said bitwise products and partial products of equal significance generated at a preceding stage, and
   3. means for periodically blanking the one of said partial sums having lowest significance, B. means for applying input partial sums generated at stage $i$ to stage $i$+1 for $i$ = 1,2, . . . M−1, said input partial sum applied at stage 1 being uniformly 0, and C. means for applying a logic 1 signal to said first stage of said multiplier at an interval such that it is ANDed with the partial product term having highest significance which is blanked by said means for periodically blanking, and D. means for controllably suppressing the generation of logic 1 signals by said means for applying.

2. Apparatus as in claim 1 wherein said means for controllably suppressing the generation of logic 1 signals comprises means for randomly generating logic 0 signals and an AND gate for ANDing said logic 1 signals and said randomly generated logic 0 signals.

3. Apparatus as in claim 2 wherein said means for randomly generating logic 0 signals comprises a random noise generator and a D flip-flop responsive to said noise generator.

4. Apparatus as in claim 1 wherein said means for controllably suppressing the generation of logic 1 signals comprises means for generating logic 0 signals and for controlling the probability of the occurrence of a logic 0 during a given interval.

* * * * *